US010177279B2

(12) United States Patent
Seong et al.

(10) Patent No.: US 10,177,279 B2
(45) Date of Patent: Jan. 8, 2019

(54) LIGHT-EMITTING DIODE WITH MULTIPLE N CONTACT STRUCTURE

(71) Applicants: Tae Yeon Seong, Seoul (KR); Ki Seok Kim, Hwaseong-si (KR); Junyong Jin, Seoul (KR)

(72) Inventors: Tae Yeon Seong, Seoul (KR); Ki Seok Kim, Hwaseong-si (KR); Junyong Jin, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/608,141

(22) Filed: May 30, 2017

(65) Prior Publication Data

US 2017/0352784 A1   Dec. 7, 2017

(30) Foreign Application Priority Data

Jun. 1, 2016   (KR) .................. 10-2016-0068311

(51) Int. Cl.
*H01L 33/10* (2010.01)
*H01L 33/38* (2010.01)
*H01L 33/24* (2010.01)

(52) U.S. Cl.
CPC ............ *H01L 33/382* (2013.01); *H01L 33/10* (2013.01); *H01L 33/24* (2013.01); *H01L 2933/0016* (2013.01)

(58) Field of Classification Search
CPC ....... H01L 33/32; H01L 33/382; H01L 33/10; H01L 33/007
See application file for complete search history.

(56) References Cited

U.S. PATENT DOCUMENTS 8,987,772 B2   3/2015   Kim et al.
9,520,536 B2   12/2016   Kim et al.
(Continued)

FOREIGN PATENT DOCUMENTS

KR   1020120053571 A   5/2012
KR   20130053005 A * 5/2013
(Continued)

OTHER PUBLICATIONS

Ye Seul Kim et al.; "Light Emitting Diode Chip Having Plurality of Mesa Structures"; Bibliographic data of KR20120053571 (A); May 29, 2012; https://worldwide.espacenet.com.
(Continued)

*Primary Examiner* — Steven H Loke
*Assistant Examiner* — Juanita B Rhodes
(74) *Attorney, Agent, or Firm* — Andrew D. Fortney; Central California IP Group, P.C.

(57) ABSTRACT

Provided are a horizontal light emitting diode (LED) device and a method for fabricating the same. The horizontal LED device includes a sapphire substrate; an n-type GaN layer disposed on the sapphire substrate; an activation layer disposed on the n-type GaN layer; a p-type GaN layer disposed on the activation layer; a current spreading layer disposed on the p-type GaN layer; a p-electrode disposed on the current spreading layer; a plurality of holes exposing the n-type GaN layer through the current spreading layer, the p-type GaN layer, and activation layer; and an n-electrode disposed on the exposed n-type GaN layer and being in ohmic contact with the exposed n-type GaN layer at a plurality of positions on bottom surfaces of the plurality of holes.

18 Claims, 11 Drawing Sheets

(56) References Cited

U.S. PATENT DOCUMENTS

| | | | | |
|---|---|---|---|---|
| 2007/0228393 | A1* | 10/2007 | Yoneda | H01L 33/22 |
| | | | | 257/79 |
| 2012/0241718 | A1* | 9/2012 | Chen | H01L 33/38 |
| | | | | 257/13 |
| 2013/0053005 | A1* | 2/2013 | Ramer | H04W 4/025 |
| | | | | 455/414.1 |
| 2016/0155898 | A1* | 6/2016 | Hsu | H01L 33/145 |
| | | | | 257/98 |
| 2017/0331009 | A1* | 11/2017 | Shioji | H01L 33/46 |

FOREIGN PATENT DOCUMENTS

| | | | |
|---|---|---|---|
| KR | 20130053005 A | * | 5/2013 |
| KR | 1020130053005 A | | 5/2013 |
| KR | 1020130111792 A | | 10/2013 |

OTHER PUBLICATIONS

Jae Won Seo et al.; "Light Emitting Device Capable of Improving Light Extraction Efficiency"; Bibliographic data of KR20130053005 (A); May 23, 2013; https://worldwide.espacenet.com.

Jung Sub Song et al.; "Nitride Based Light Emitting Diode With Improved Current Spreading Performance and High Brightness"; Bibliographic data of KR20130111792 (A); Oct. 11, 2013; https://worldwide.espacenet.com.

* cited by examiner

LIGHT-EMITTING DIODE WITH MULTIPLE N CONTACT STRUCTURE

CROSS-REFERENCE TO RELATED APPLICATIONS

This U.S. non-provisional patent application claims priority under 35 U.S.C. § 119 to Korean Patent Application No. 10-2016-0068311, filed on Jun. 1, 2016, in the Korean Intellectual Property Office, the entire contents of which are hereby incorporated by reference.

TECHNICAL FIELD

The present disclosure relates to conductor light emitting diodes and, more particularly, to a light emitting diode with a multiple n contact structure in a mesa structure. Accordingly, a semiconductor light emitting diode device with a large area of an activation layer and superior light extraction efficiency may be implemented.

BACKGROUND

A light emitting diode (LED) is a semiconductor device that emits various lights depending on recombination of electrons and holes at a junction of p-type and n-type semiconductors when a current is applied.

A light emitting diode, which is a III-V nitride-based semiconductor device, has started from a lateral (or horizontal) structure and has been developed toward a flip-chip and vertical structure for high-luminance characteristics. In particular, vertical LEDs are being actively developed to achieve high-luminance characteristics under the high-power/high-temperature circumstance such as vehicle lighting application.

An LED structure formed of GaN constitutes a lateral structure and a flip-chip and vertical structure. Characteristics that should be commonly secured in these LEDs irrespective of individual structure and shape are low non-contact resistance, uniform current spreading, efficient heat diffusion, photon extraction efficiency, and the like.

In general, semiconductor light emitting diodes may be classified into a light emitting diode (LED) and a laser diode (LD). In particular, a light emitting diode and a laser diode commonly have a p-n junction where light, i.e., photon is generated when forward bias current flows. In particular, the key point of a light emitting diode using a III group nitride-based material is to enhance light extraction efficiency.

When current is applied to a p-n junction structure of a light emitting diode, light is generated at an activation layer between a p-type semiconductor and an n-type semiconductor.

In the case of a horizontal light emitting diode, to form an n-electrode, an n-type semiconductor layer is exposed by means of dry mesa etching to form a mesa structure. In this case, a large amount of activation layer is removed. A study is required to overcome this disadvantage.

Since current in the horizontal light emitting diode does not uniformly spread, local light emission occurs, which is called current crowding. Another study is required to overcome the current crowding.

SUMMARY

Embodiments of the present disclosure provide a semiconductor light emitting diode with improved light extraction efficiency which is achieved by overcoming current crowding. To overcome the current crowding, shape/area ratio of multiple n contact areas formed by mesa etching in a horizontal LED are non-uniformly adjusted.

Embodiments of the present disclosure provide a semiconductor light emitting diode with improved light extraction efficiency which is achieved by introducing a distributed Bragg reflector (DBR) or an omnidirectional reflector (ODR) to a sidewall of a multiple hall structure as a passivation layer in an LED device having n contact areas of the multiple hall structure where loss of an activation layer area is minimized.

A horizontal light emitting diode (LED) device according to an example embodiment of the present disclosure includes: a sapphire substrate; a n-type GaN layer disposed on the sapphire substrate; an activation layer disposed on the n-type GaN layer; a p-type GaN layer disposed on the activation layer; a current spreading layer disposed on the p-type GaN layer; a p-electrode disposed on the current spreading layer; a plurality of holes exposing the n-type GaN layer through the current spreading layer, the p-type GaN layer, and activation layer; and an n-electrode disposed on the exposed n-type GaN layer and being in ohmic contact with the exposed n-type GaN layer at a plurality of positions on bottom surfaces of the plurality of holes.

In an example embodiment, the p-electrode may include a p-electrode pad and at least two p-electrode fingers branching from the p-electrode pad to extend in the first direction. The n-electrode may include an n-electrode pad and at least one n-electrode pad extending from the n-electrode pad in the first direction. The n-electrode finger may extend between the p-electrode fingers. The holes may be arranged in the first direction. The n-electrode finger may be aligned with the holes.

In an example embodiment, a contact area between bottom surfaces of the holes and the n-electrode finger may decrease sequentially as proceeding in a direction of the p-electrode pad.

In an example embodiment, a width of the activation layer between the holes in the first direction may be smaller than a mesa width of the holes and greater than a width of the n-electrode finger in a second direction perpendicular to the first direction.

In an example embodiment, the horizontal LED device may further include: a passivation layer disposed on opposite side surfaces of the holes in the first direction and the current spreading layer between the holes.

In an example embodiment, the passivation layer may be a distributed Bragg reflector of a multilayer structure having different refractive indices.

In an example embodiment, the passivation layer may be a silicon oxide layer or a magnesium fluoride layer. The activation layer, the passivation layer, and the p-electrode may be sequentially stacked to provide an omnidirectional reflector (ODR) structure.

In an example embodiment, in a current density space distribution or a light emitting intensity space distribution of the activation layer when the holes are not formed, positions where a straight line of the first direction intersects contour lines having a constant difference from the current density intensity or the light emitting intensity may be selected as positions of non-etching areas between a plurality of holes.

In an example embodiment, a width of the activation layer between the holes may be constant in the first direction. Widths of the holes of the first direction may be different from each other as proceeding in the first direction.

In an example embodiment, a width of the n-electrode finger of the second direction may vary depending on a position on bottom surfaces of the holes proceeding in the first direction.

A method for fabricating a horizontal light emitting diode (LED) device according to an example embodiment of the present disclosure may include: sequentially stacking an n-type GaN layer, an activation layer, a p-type GaN layer, and a current spreading layer on a sapphire layer; removing portions of the current spreading layer, the p-type GaN layer, the activation layer, and the n-type GaN layer by means of a patterning process to form a mesa structure, and removing portions of the current spreading layer, the p-type GaN layer, the activation layer, and the n-type GaN layer by means of a patterning process to form a mesa structure to form a plurality of holes; depositing a passivation layer on the sapphire substrate where the holes are formed and forming a passivation layer on sidewalls of non-etching areas between the holes and the current spreading layer between the holes by means of a patterning process; depositing and patterning an n-electrode material on the sapphire substrate, where the passivation layer is formed, to form an n-electrode being in contact with the n-type GaN layer exposed on the bottom surfaces of the holes; and depositing a p-electrode material on the sapphire substrate where the n-electrode is formed and forming a p-electrode on the current spreading layer by means of a patterning process.

In an example embodiment, the passivation layer may be a structure in which a silicon oxide layer and a titanium oxide layer are alternately stacked.

In an example embodiment, the passivation layer may be a silicon oxide layer or a magnesium fluoride layer.

A method for fabricating a horizontal light emitting diode (LED) device according to an example embodiment of the present disclosure may include: investigating characteristics of a horizontal light emitting diode (LED) including a mesa structure and an n-electrode finger between p-electrode fingers extending in a first direction to extract a current density space distribution or a light emitting intensity space distribution of the horizontal LED; selecting positions where a straight line of the first direction intersects contour lines having a constant difference of the current density intensity or the light emitting intensity in the current density space distribution or the light emitting intensity space distribution; and disposing holes between the selected positions and fabricating a horizontal light emitting diode (LED) including a mesa structure and an n-electrode finger between p-electrode fingers extending in the first direction.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1A:
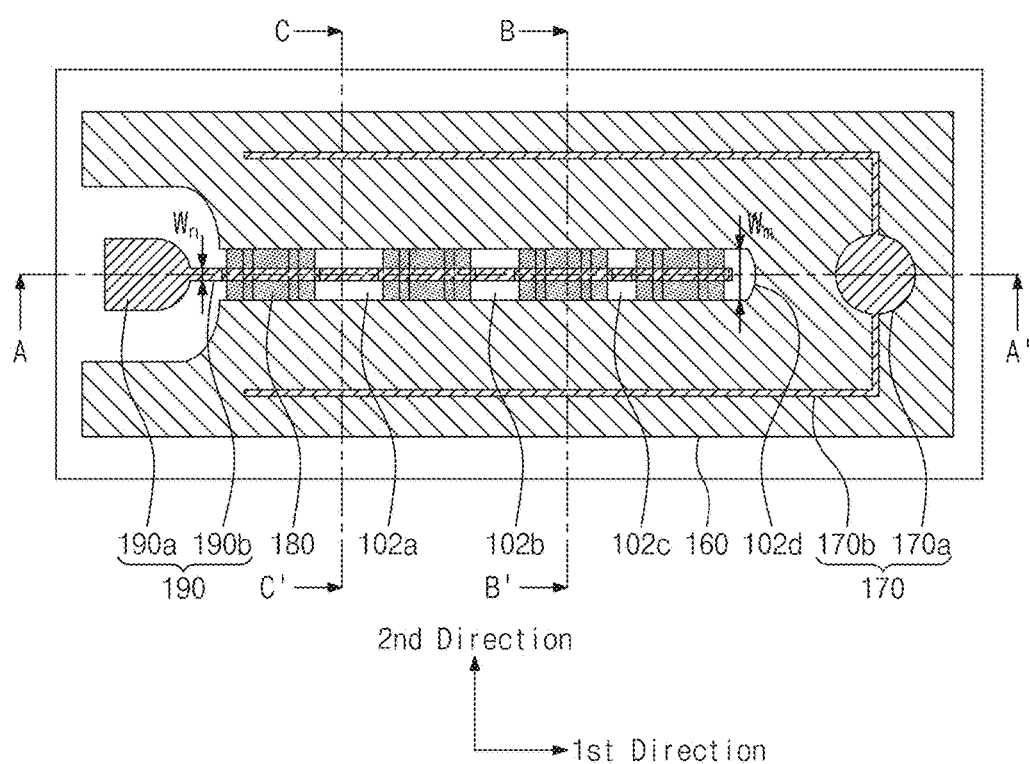
FIG. 1A is a top plan view of a horizontal LED device according to an example embodiment of the present disclosure.

In the case that a conventional horizontal LED is formed, to reduce current crowding effect, an n-electrode is formed while extending in a first direction along the inside of a trench that isolates an activation layer. In this case, a large amount of the activation layer is removed during a mesa etching process to reduce an active region. Even in the case of having a structure where an n-electrode finger extends between p-electrode fingers, current spreading effect is not sufficient. Accordingly, there is a need for an LED structure which further improves the current spreading effect, secures a wide active region, and increases the overall intensity of radiation.

A light emitting distribution of a conventional horizontal LED is that light intensity is high around a p-electrode and low around an n-electrode. Current mainly flows between the p-electrode and an n-electrode finger extending around the p-electrode.

Meanwhile, a light emitting distribution of a conventional horizontal LED is that light intensity is high around an n-electrode and low around a p-electrode.

When current crowding occurs around a p-electrode, light intensity may be high around the p-electrode. Alternatively, when current crowding occurs around an n-electrode, light intensity may be high around the n-electrode.

According to an example embodiment of the present disclosure, not only current crowding around a p-electrode but also current crowding around an n-electrode may be eliminated. Current crowding may occur around an n-electrode or a p-electrode according to conductivity of each of layers (current spreading layer, p-GaN, n-GaN, etc.). As a substrate is formed of sapphire that is an insulator, current of a conventional horizontal LED is non-uniform because it flows horizontally. The non-uniform degree of the current distribution may vary depending on electrical conductivity of a semiconductor grown on a sapphire substrate or a current spreading layer deposited on the sapphire substrate.

According to an example embodiment of the present disclosure, current (or light emission) concentration around a p-electrode or an n-electrode may be reduced.

For example, to eliminate current crowding effect around a p-electrode, a multiple n contact structure may be used to intentionally come in contact an n-electrode at a plurality of positions. Specifically, an n-electrode finger disposed around the p-electrode is formed to have a high n contact sheet resistance and an n-electrode finger disposed around an n-electrode pad is formed to have a low n contact sheet resistance. Thus, current may not flow concentrically around the p-electrode but flow after being distributed spatially uniformly.

A plurality of n electrode contact areas are formed such that current distribution is uniform. Each of the n-electrode contact areas may be formed using a plurality of holes formed simultaneously with mesa etching. By adjusting a contact sheet resistance of the n-electrode contact area, the current crowding effect may be reduced to minimize a nonluminous area in a device.

According to an example embodiment of the present disclosure, since an n-electrode passes over a current spreading layer between holes, a passivation layer is disposed between the current spreading layer and the n-electrode to achieve electrical insulation. The passivation layer may be patterned to be selectively disposed only on a path along which the n-electrode passes. The passivation layer may employ an ODR structure or a DBR structure. In this case, light generated below an n-electrode in a non-etching area may be extracted to the outside of a device.

According to an example embodiment of the present disclosure, during a mesa dry etching process to expose an n-type GaN layer in a semiconductor device using a III group nitride-based material, a plurality of holes arranged in a first direction are formed such that an n-electrode finger comes in contact with the n-type GaN layer at an irregular interval.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1A is a top plan view of a horizontal LED device according to an example embodiment of the present disclosure.

Figure 1B:
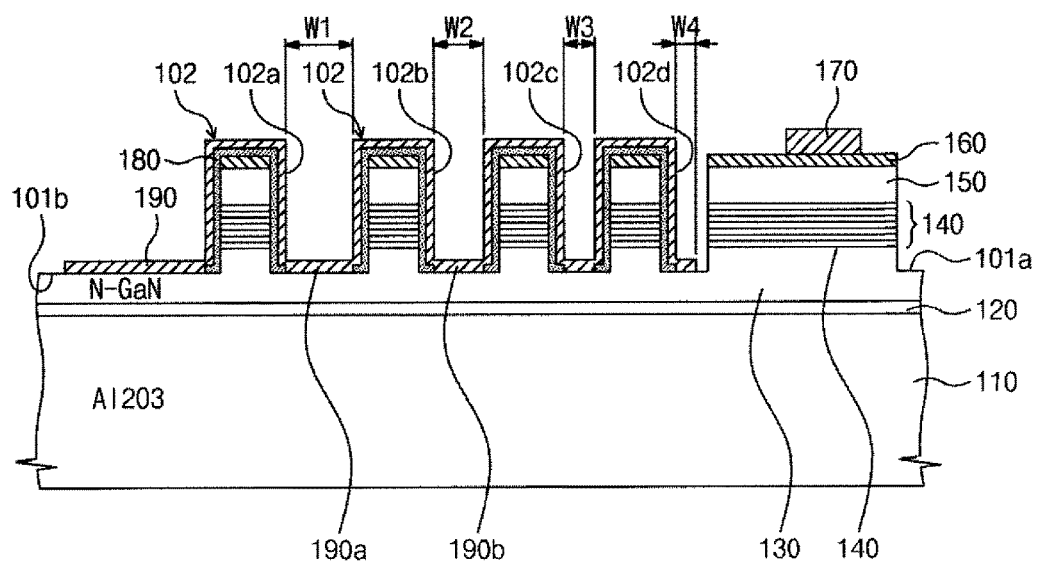
FIG. 1B is a cross-sectional view taken along the line A-A' of FIG. 1A in a first direction.

FIG. 1B is a cross-sectional view taken along the line A-A' of FIG. 1A in a first direction.

Figure 1C:
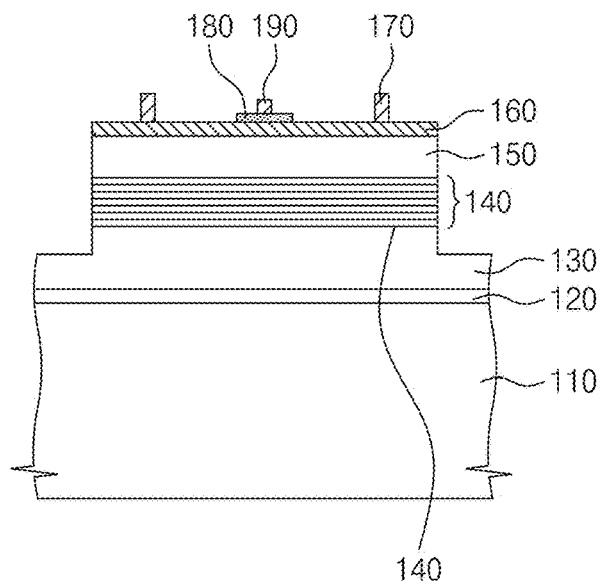
FIG. 1C is a cross-sectional view taken along the line B-B' of FIG. 1A.

FIG. 1C is a cross-sectional view taken along the line B-B' of FIG. 1A.

Figure 1D:
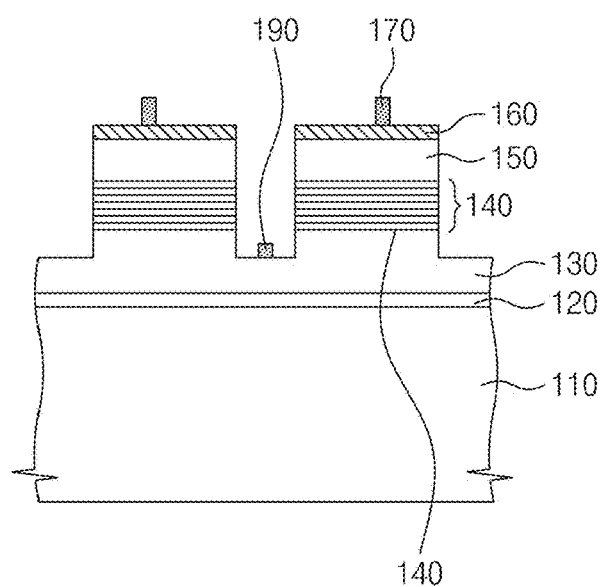
FIG. 1D is a cross-sectional view taken along the line C-C' of FIG. 1A.

FIG. 1D is a cross-sectional view taken along the line C-C' of FIG. 1A.

Referring to FIGS. 1A to 1D, a horizontal light emitting diode (LED) device 100 includes a sapphire substrate 110, a n-type GaN layer 130 disposed on the sapphire substrate 110, an activation layer 140 disposed on the n-type GaN layer 130, a p-type GaN layer 150 disposed on the activation layer 140, a current spreading layer 160 disposed on the p-type GaN layer 150, a p-electrode 170 disposed on the current spreading layer 160, a plurality of holes 102a to 102d exposing the n-type GaN layer 130 through the current spreading layer 160, the p-type GaN layer 150, and activation layer 140, and an n-electrode 190 disposed on the exposed n-type GaN layer 130 and being in ohmic contact with the exposed n-type GaN layer 130 at a plurality of positions on bottom surfaces of the plurality of holes 102a to 102d.

The sapphire substrate 110 may be a c-plane sapphire substrate. A GaN buffer layer 120 may be disposed on the sapphire substrate 110 to reduce a defect caused by lattice mismatch. The sapphire substrate 110 may be changed to a silicon carbide substrate or the like.

The n-type GaN layer 130 may be deposited on the GaN buffer layer 120 to a thickness of several micrometers. An n-type impurity may be silicon (Si).

The activation layer 140 may be deposited on the n-type GaN layer 130. The activation layer 140 may be a double heterostructure, a single quantum well or multiple quantum wells. In the case of a blue or green LED, the multiple quantum wells may be an InGaN/GaN structure. In the case of ultraviolet ray, the multiple quantum wells may be an AlGaN/InGaN structure.

An electron blocking layer (not shown) may be additionally disposed on the activation layer 140. Since electron leakage current is greater than hole leakage current, the electron block layer may block the electron current.

The p-type GaN layer 150 may be disposed on the electron blocking layer or the activation layer 140. A p-type impurity may be magnesium (Mg).

The current spreading layer 160 may be disposed on the p-type GaN layer 150. The current spreading layer 160 may be transparent conductive metal oxide. The current spreading layer 160 may uniformly supply current to the p-type GaN layer 150 to provide light emission to the whole area of the activation layer 140. Indium tin oxide (ITO) may be used as the current spreading layer 160. Preferably, the current spreading layer 160 may have a transparent characteristic, a sufficiently low sheet resistance characteristic, and a characteristic to form an ohmic junction with the p-type GaN layer 150. When a thickness of the current spreading layer 160 increases in order to reduce a resistance of the current spreading layer 160, transparency may be reduced but current spreading characteristics may be improved. The current spreading layer 160 may be formed to a sufficiently small thickness of several tens of nanometers (nm) to have sufficient permeability.

The p-electrode 170 may be disposed on the current spreading layer 160. Conventionally, when the p-electrode 170 is disposed on the current spreading layer 160, the p-electrode 170 may be formed of a metal and operate as an electrode pad for wire connection while functioning as an electrode.

The p-electrode 170 may include a p-electrode pad 170a connected to the outside through a wire and a p-electrode finger 170b branching to the p-electrode pad 170a. The p-electrode finger 170b may have a comb shape on the current spreading layer 160 and may uniformly distribute current. The p-electrode 170 may have a sufficiently low sheet resistance. The p-electrode pad 170a may be disposed at a right side from the center of the sapphire substrate 110, and the p-electrode finger 170b may have a ⊃ shape. The p-electrode finger 170b splits into two branches at the p-electrode pad 170a to extend in a second direction and then may extend in a first direction. The p-electrode 170 may be a Ti or Cr-based multilayer structure such as Ni/Au structure, Ti/Al structure, Ti/Al/Ni/Au, Cr/Al or Cr/Al/Ni/Au.

The p-electrode finger 170b may be provided in singularity or plurality, and an n-electrode finger 190b may extend between the p-electrode fingers 170b and may be provided in singularity or plurality.

The plurality of holes 102a to 102d may expose the n-type GaN layer 130 through the p-type GaN layer 150 and the activation layer 140 and may be arranged in the first direction. The holes 102a to 102d may have different widths as they proceed in the first direction and may have the same mesa width (Wm) in the second direction.

According to a modified embodiment of the present disclosure, the holes 102a to 102d may be modified into various forms as long as they have a reduced contact area with the n-electrode finger 190b while proceeding in the first direction.

According to a modified embodiment of the present disclosure, the holes 102a to 102d may be arranged in various forms as long as they have different contact areas between the n-electrode and the exposed n-type GaN layer 130.

The n-electrode 190 may be disposed on the exposed n-type GaN layer 130 and may be in ohmic contact with the exposed n-type GaN layer 130 at a plurality of positions on bottom surfaces of the holes 102a to 102d. The n-electrode 190 may include an n-electrode pad 190a and the n-electrode finger 190b. The n-electrode pad 190a may be disposed at a left side from the center of the sapphire substrate 110, and the n-electrode finger 190b may extend from the n-electrode pad 190a in the first direction. The n-electrode finger 190b may cover a side surface and a top surface of the non-etching areas 102 disposed between the holes 102a to 102d. The n-electrode finger 190b may extend in the first direction to be in contact with a bottom surface of the rightmost hole 102d.

The mesa structure is formed by etching the p-type GaN layer 150 and the activation layer 140. The mesa structure may include an edge mesa area 101a formed along the periphery of the sapphire substrate 110 and an electrode pad mesa area 101b in which the n-electrode pad 190a may be disposed in the left center of the sapphire substrate 110.

In a conventional LED, an n-electrode finger is disposed between p-electrode fingers along a trench extending in the first direction by removing a p-type GaN layer and an activation layer. In the case of this structure, the intensity of light generated between a right end of the n-electrode finger and a p-electrode pad may be high. In contrast, the intensity of light emitted around the p-electrode pad may be high. This current crowding effect may vary depending on electrical conductivity of a grown semiconductor or a deposited current spreading layer. To overcome the current crowding problem, the n-electrode finger may be electrically connected to the n-type GaN layer at a plurality of positions.

For example, the holes 102a to 102d may include first to fourth holes. The first hole 102a or the n-type electrode finger 190b may have a first width W1 which is in contact with the n-type GaN layer 130 in the first direction, the second hole 102b or the n-electrode finger 190b may have a second width W2 which is in contact with the n-type GaN layer 130 in the first direction, the third hole 102c or the n-electrode finger 190b may have a third width W3 which is in contact with the n-type GaN layer 130 in the first direction, and the fourth hole 102d or the n-electrode finger 190b may have a fourth width W4 which is in contact with the n-type GaN layer 130 in the first direction. The first to fourth widths W1 to W4 may decrease in the order, as follows: W1>W2>W3>W4. Accordingly, the n-electrode finger 190b passing the holes 102a to 102d and a contact sheet resistance generated by the n-type GaN layer 130 may be in inverse proportion to an area. That is, the contact sheet resistance of the n-electrode finger passing the holes 102a to 102d may increase as approaching in a direction of the p-electrode pad 170a. Accordingly, the resistance structure may suppress the current crowding. The hole structure or the multiple n contact structure may increase an area of an active region to increase a light emitting area and may provide a contact between the n-type GaN layer 130 and the n-electrode 190 at a plurality of positions to spatially distribute current. A width W of each of the non-etching areas 102 may be smaller than the mesa width Wm and greater than a width Wn of the n-electrode finger.

The non-etching areas 102 may be formed between an electrode pad mesa region 101b and the first hole 102a and between the second to fourth holes 102b to 102d. The non-etching areas 102 may have a constant width W in the first direction. The non-etching areas 102 may have a constant width W in the first direction. The width W may be constant with respect to all non-etching areas. A width W of the activation layer between the holes or the width of the non-etching areas in the first direction may be smaller than mesa width Wm of the holes and greater than a width of the n-electrode finger 190b in a second direction perpendicular to the first direction. According to the limitation, the number of holes that may be disposed may be limited to a finite number.

In a current density space distribution or a light emitting intensity space distribution of the activation layer when the holes are not formed, positions of the holes may be selected as positions where a straight line of the first direction intersects contour lines having a constant difference from the current density intensity or the light emitting intensity. An altitude difference of the contour lines may be selected such that the number of holes is between two and six.

The n-electrode 190 may include one selected from the group consisting of aluminum (Al), titanium (Ti), chrome (Cr), nickel (Ni), platinum (Pt), gold (Au), tungsten (W), copper (Cu), molybdenum (Mo) or an alloy thereof. The n-electrode 190 may be a Cr/Au structure, a Cr/Al/Pt/Au structure, a Ti/Au structure, a Ti/Al structure or Ti/Al/Ni/Au. Preferably, the n-electrode 190 may be a stacked structure of Cr/Al/Ti/Au.

The passivation layer 180 may be a distributed Bragg reflector of a multilayer structure having different refractive indices. Specifically, the passivation layer 180 may be a multilayer structure including $SiO_2/TiO_2/SiO_2/TiO_2$. Accordingly, light emitted from the non-etching area 102 may be reflected by the passivation layer 180 to be emitted to an area in which the n-electrode 190 is not disposed. The passivation layer 180 may suppress loss of light through reflection and may block electrical connections between the n-electrode 190 and the activation layer 140, the p-type GaN layer 150, and the current spreading layer 160.

To block the electrical connections between the n-electrode finger 190b and the activation layer 140, the p-type GaN layer 150, and the current spreading layer 160, the n-electrode finger 190b may be bent along the passivation layer 180 disposed on a side surface and a top surface of the non-etching areas while extending from the n-electrode pad in the first direction.

According to a modified embodiment of the present disclosure, the passivation layer 180 may be a silicon oxide layer and the activation layer 140, the passivation 180, and the p-electrode 170 may be sequentially stacked to provide an omnidirectional reflector (ODR) structure. Thus, the light emitted from the non-etching area may be reflected by the passivation layer 180 to be emitted to an area in which the n-electrode 190 is not disposed.

According to a modified embodiment of the present disclosure, a width of the n-electrode finger 190b of the second direction may vary depending on positions on the bottom surfaces of the holes which proceed in the first direction. Specifically, the holes may have the same width in the first direction and a width of the n-electrode finger 190*b* may gradually decrease while proceeding in the first direction.

According to a modified embodiment of the present disclosure, a horizontal LED device may include a p-type GaN layer 130, an activation layer 140, an n-type GaN layer 150, and a current spreading layer 160 which are sequentially stacked on a substrate. In the horizontal LED device, the n-type GaN layer 150 may be exposed by locally removing the p-type GaN layer 130 and the activation layer 140 at an edge of the LED device and a position where an n-electrode is to be disposed. The activation layer 140, the n-type GaN layer 150, and the current spreading layer 160 may be vertically aligned with each other.

The n-electrode 190 may be disposed in contact with the exposed n-type GaN layer 150 and may include an n-electrode pad and an n-electrode finger branching from the n-electrode pad. The n-electrode finger may be provided in singularity or plurality and may extend in the first direction. The p-electrode 170 may be disposed with a pattern on the current spreading layer 160 and may include a p-electrode pad and a p-electrode finger branching from the p-electrode pad to extend toward the n-electrode pad in the first direction. The p-electrode finger may be provided in at least two and may extend in the first direction.

The n-electrode pad and the p-electrode pad may be disposed at opposite edges of the LED device to face each other. The n-electrode finger may extend between the p-electrode fingers in the first direction to uniformly distribute current. As the n-electrode finger extends in the first direction, the activation layer and the current spreading layer may be divided into at least two areas. To form multiple n contacts, a plurality of holes 102*a* may be formed on a path along which the n-electrode finger passes and the holes and the n-electrode finger may be in ohmic contact with each other.

Alternatively, to form multiple n contacts, a plurality of non-etching areas 102 may be formed on a path along which the n-electrode finger passes. The non-etching areas may be defined by holes. The holes may provide an ohmic junction with the n-electrode finger. The non-etching areas may connect an upper area and a lower area divided by the n-electrode finger. The n-electrode finger may be in contact with the holes 102*a* across the non-etching areas 102. A passivation layer may be disposed on a side surface and a top surface of the non-etching areas to prevent the n-electrode finger from being in electric contact with the non-etching areas. A uniform light emitting distribution may be obtained by adjusting structure, shape, and intervals of the non-etching areas. Alternatively, a uniform light emitting distribution may be obtained by adjusting structure, shape, and intervals of the holes.

FIGS. 2A to 2D illustrate a method for manufacturing an LED device according to an example embodiment of the present disclosure.

Figure 2A:
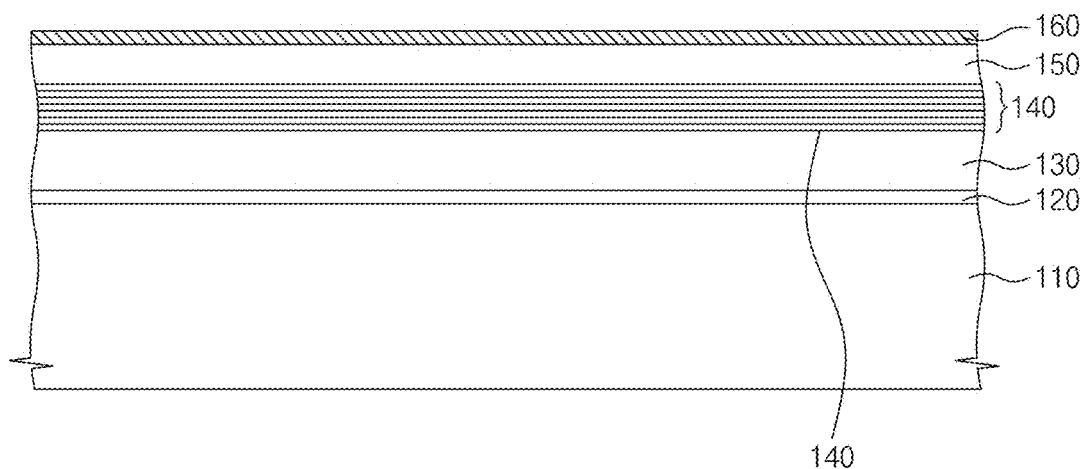
FIGS. 2A to 2D illustrate a method for manufacturing an LED device according to an example embodiment of the present disclosure.

Referring to FIG. 2A, a GaN buffer layer 120, a n-type GaN layer 130, an activation layer 140, and a p-type GaN layer 150 are stacked on a sapphire substrate 110. The GaN buffer layer 120, the n-type GaN layer 130, the activation layer 140, and the p-type GaN layer 150 may be grown by means of metal-organic chemical vapor deposition (MOCVD). A current spreading layer 160 may be deposited on the p-type GaN layer 150. The current spreading layer 160 may be a transparent conductive metal oxide layer. For example, the current spreading layer 160 may be indium tin oxide (ITO).

Figure 2B:
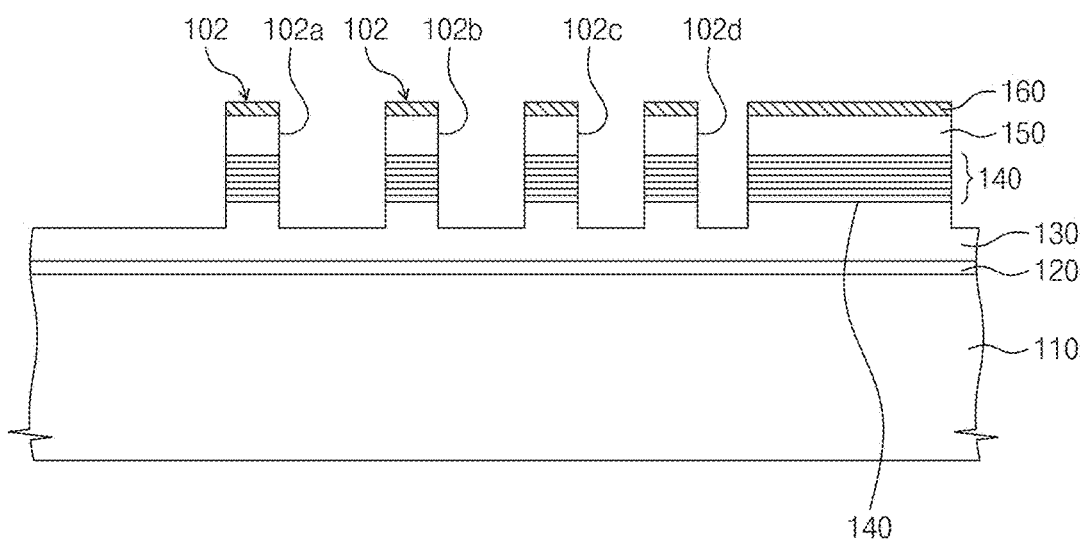

Referring to FIG. 2B, a photoresist mask pattern may be formed on the current spreading layer 160 by means of a photolithograph process. An anisotropic mesa etching process may be performed using the photoresist mask pattern as an etch mask to form a mesa structure. The mesa structure locally removes the current spreading layer 160, the p-type GaN layer 150, and the activation layer 140. The mesa structure may include an edge area in which circumferences of the current spreading layer 160, the p-type GaN layer 150, and the activation layers are removed and an n-electrode pad area in which an n-electrode pad is to be disposed. During the formation of the mesa structure, a plurality of holes 102*a* to 102*d* aligned in the first direction may be formed. Non-etching areas 102 are disposed in the first direction by the holes 102*a* to 102*d*.

Figure 2C:
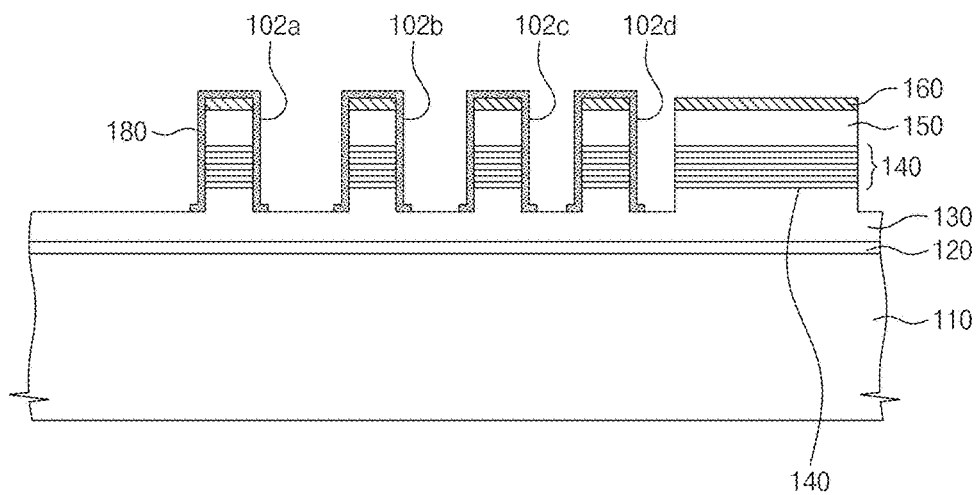

Referring to FIG. 2C, a passivation layer 180 is deposited on the sapphire substrate 110 where the holes 102*a* to 102*d* are formed. If a patterning process is used, the passivation layer 180 is formed only on a side surface and a top surface of the non-etching areas 102 of the first direction. The passivation layer 180 may be patterned so as not to the entire surfaces of the holes 102*a* to 102*d*. The passivation layer 180 may a single-layer structure of silicon oxide or a multilayer structure of [SiO$_2$/TiO$_2$]m (m being an integer greater than or equal to 1). The multilayer structure may provide a distributed Bragg reflection. A center wavelength of the distributed Bragg reflection may match a light emitting center wavelength of eh activation layer 140.

Figure 2D:
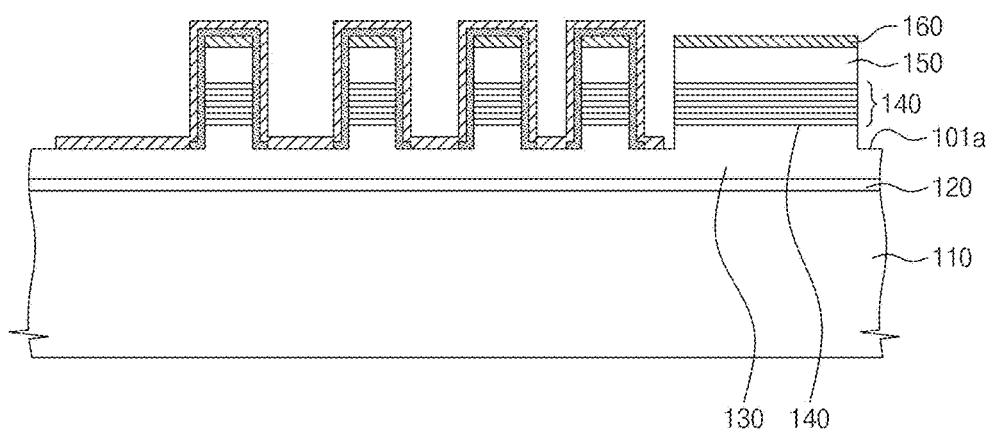

Referring to FIG. 2D, an n-electrode 190 extending from the exposed n-type GaN layer 130 of the mesa structure in the first direction may be formed by means of a lift-off process. The n-electrode 190 may be a stacked structure of Cr/Al/TiAu. The n-electrode may form multiple n contact areas on the bottom surfaces of the holes 102*a* to 102*d*.

A width Wn of an n-electrode finger 190*b* may be smaller than a mesa width Wm. A contact area of the n-electrode finger 190*b* and the n-type GaN layer 130 exposed on the bottom surfaces of the holes 102*a* to 102*d* may sequentially decrease. A width of the hole of the first direction is changed to sequentially change the contact area. A width of each of the non-etching areas 102 may be constant according to a position. The width W of the non-etching area may be smaller than the mesa width Wm and greater than the width Wn of the n-electrode.

According to a modified embodiment of the present disclosure, the contact area may be changed according to a position by changing the width of the n-electrode according to the position.

Returning to FIG. 1B, a p-electrode 170 is formed on the current spreading layer 160 by means of a lift-off process. The p-electrode 170 may be a Ti or Cr-based multilayer structure such as Ni/Au structure, Ti/Al structure, Ti/Al/Ni/Au. Cr/Al or Cr/Al/Ni/Au.

Figure 3:
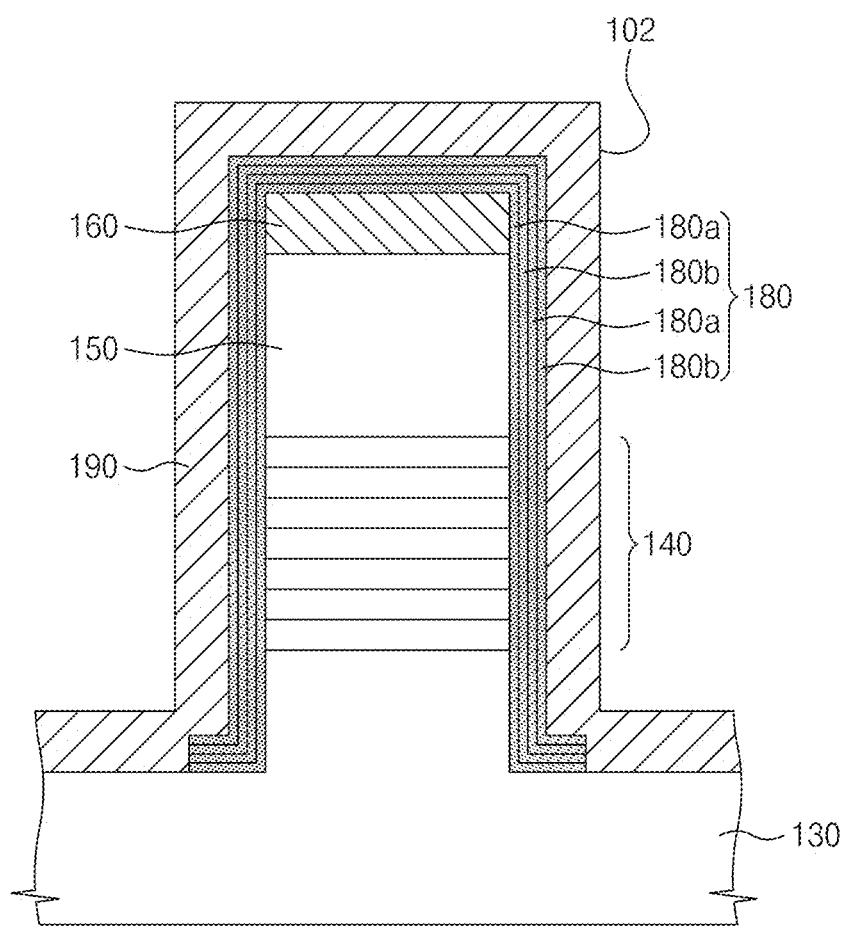
FIG. 3 is a cross-sectional view of a passivation layer according to an example embodiment of the present disclosure.

FIG. 3 is a cross-sectional view of a passivation layer according to an example embodiment of the present disclosure.

Referring to FIG. 3, a passivation 180 may be a distributed Bragg reflection structure in which two layers 180*a* and 180*b* having different refractive indices are alternately disposed. For example, the passivation layer 180 may be a multilayer structure of [SiO2/TiO2]m (m being an integer greater than or equal to 2).

Figure 4:
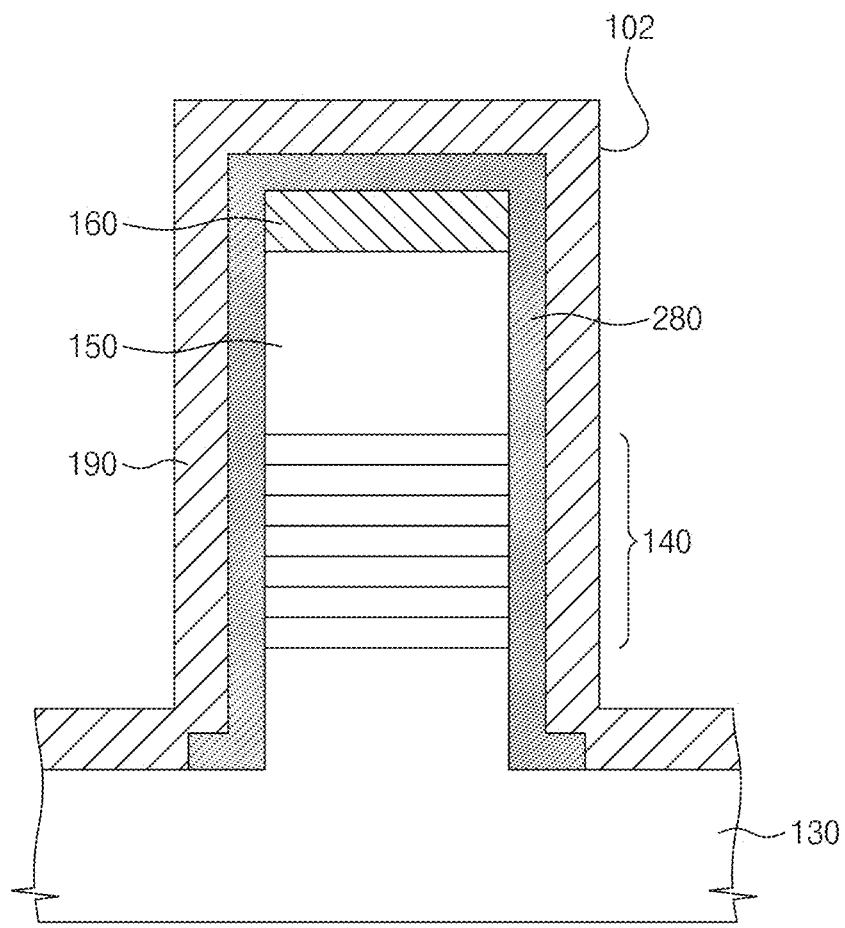
FIG. 4 is a cross-sectional view of a passivation layer according to another example embodiment of the present disclosure.

FIG. 4 is a cross-sectional view of a passivation layer according to another example embodiment of the present disclosure.

Referring to FIG. 4, a passivation layer 280 may be a dielectric layer having a low refractive index. For example, the passivation layer 280 may be a silicon oxide layer. An activation layer, the passivation layer 280, and an n-electrode may provide an omnidirectional reflector (ODR) structure which provides a high reflectivity.

Figure 5:
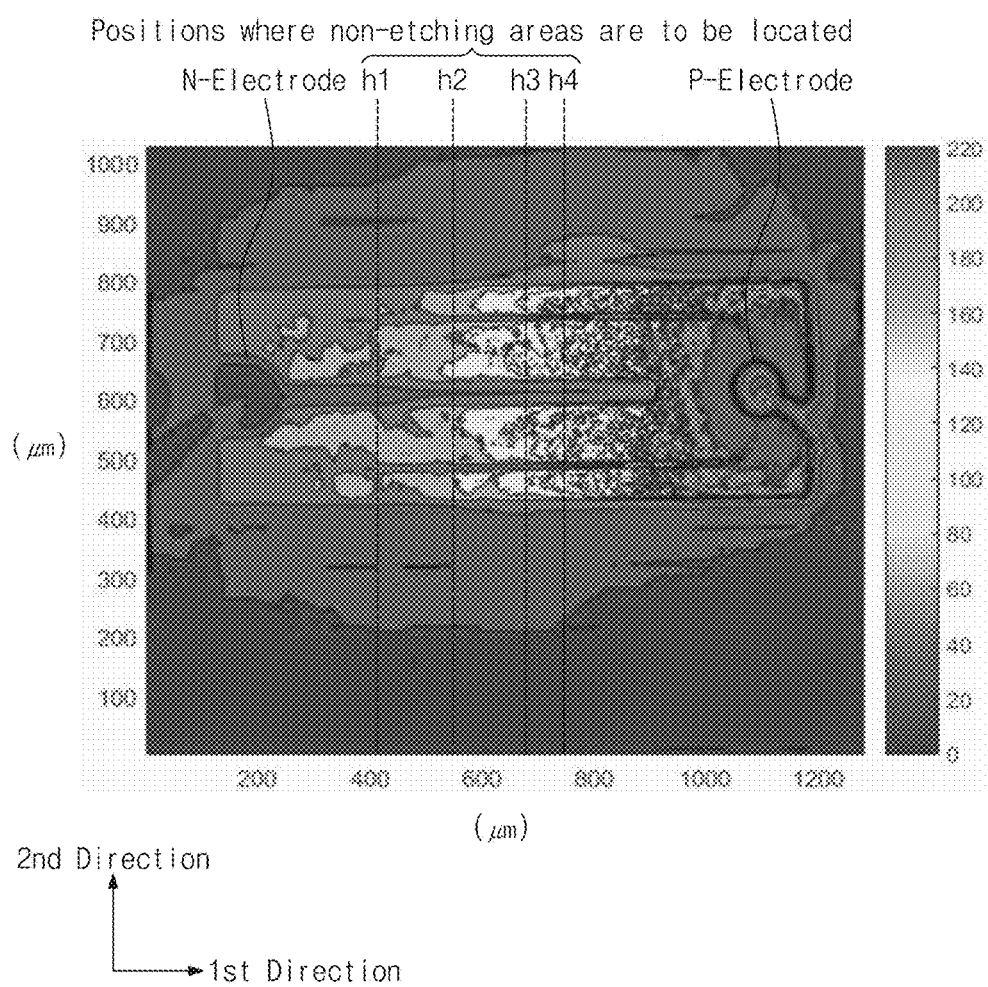
FIG. 5 illustrates a light emitting intensity distribution for determining positions of holes to form a horizontal LED device according to an example embodiment of the present disclosure.

FIG. 5 illustrates a light emitting intensity distribution for determining positions of holes to form a horizontal LED device according to an example embodiment of the present disclosure.

Referring to FIG. 5, in a method for fabricating a horizontal light emitting diode (LED) device according to an example embodiment of the present disclosure, a current density space distribution or a light emitting intensity space distribution of a horizontal LED including a mesa structure and an n-electrode finger 190b between p-electrode fingers 170b extending in a first direction is extracted by investigating characteristics of the horizontal LED. In the current density space distribution or the light emitting intensity space distribution, positions are selected where a straight line of the first direction intersects contour lines having a constant difference of the current density intensity or the light emitting intensity. The method may include disposing holes between the selected positions and fabricating a horizontal LED including a mesa structure and an n-electrode finger between p-electrode fingers extending in the first direction. The holes are formed to expose an underlying n-type GaN layer.

A light emitting distribution of a conventional LED is displayed. A contour line indicates a constant light emitting intensity. The contour lines are displayed while having a constant value difference according to the light emitting intensity. In a current density space distribution or a light emitting density space distribution of an activation layer when the holes are not formed, a position where non-etching areas between the plurality of holes are to be disposed may be selected as positions where a straight line of the first direction intersect contour lines having a constant difference of the current density intensity or the light emitting intensity. The contour lines may be selected to have a constant value difference and may be selected to be provided in two to ten between an n-electrode pad and a p-electrode pad.

Specifically, in a light emitting distribution of a conventional LED, h1, h2, h3, and h4 may be positions where non-etching areas are to be disposed. A contour line of the light emitting distribution may be identical or similar to a contour line of a current distribution. That is, when non-etching areas are formed at the position where the straight line of the first direction intersects the contour line in the current distribution or the light emitting distribution, a position to adjust a resistance may be selected by the holes. If a contact area is adjusted at the selected position, resistance distribution between n-contact holes may be controlled.

Figure 6A:
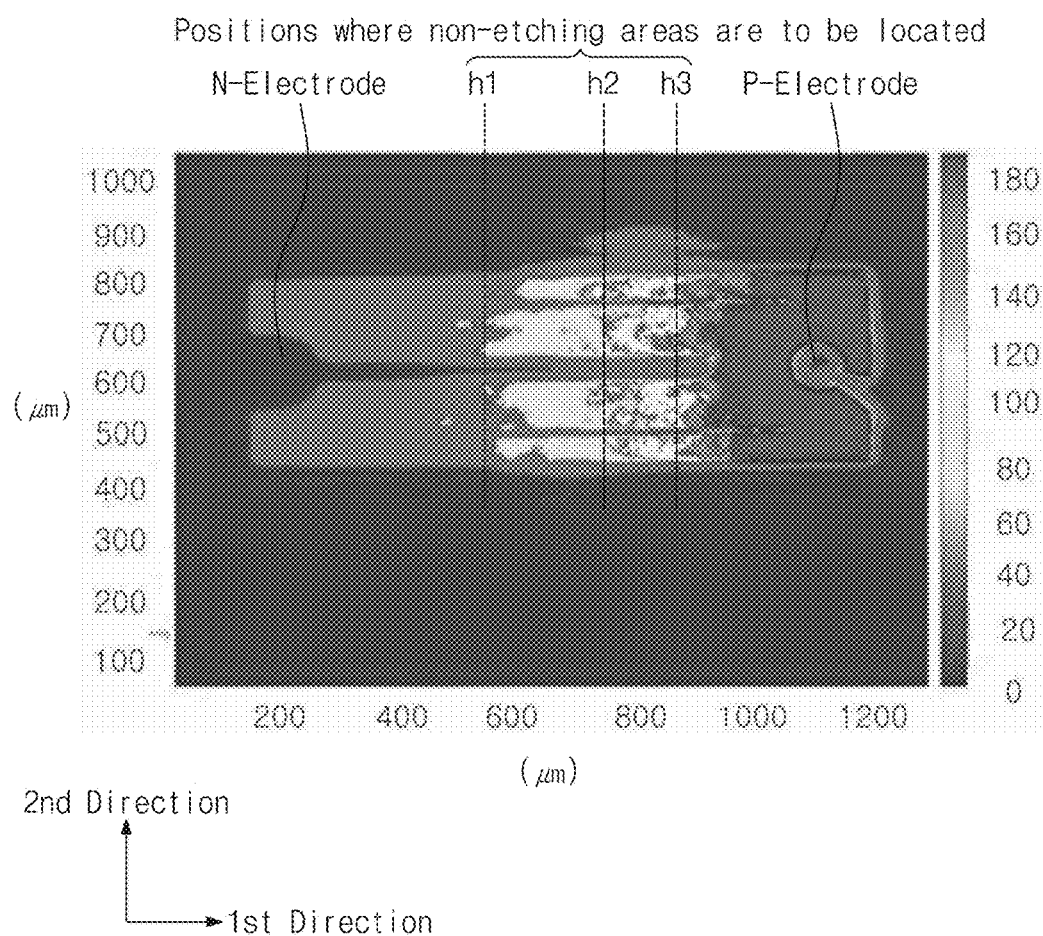
FIGS. 6A and 6B show contour lines of a light emitting space distribution having different altitude differences.
Figure 6B:
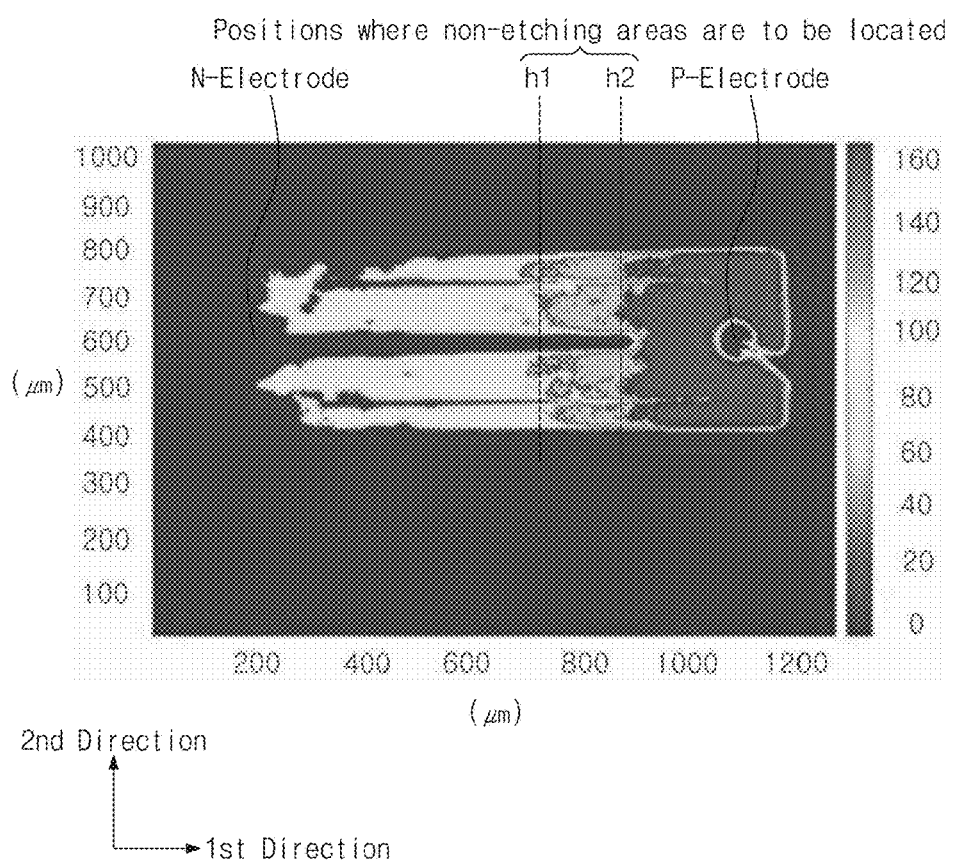

FIGS. 6A and 6B show contour lines of a light emitting space distribution having different altitude differences.

Referring to FIG. 6A, positions of non-etching areas may be selected as h1, h2, and h3.

Referring to FIG. 6B, positions of non-etching areas may be selected as h1 and h2.

Figure 7A:
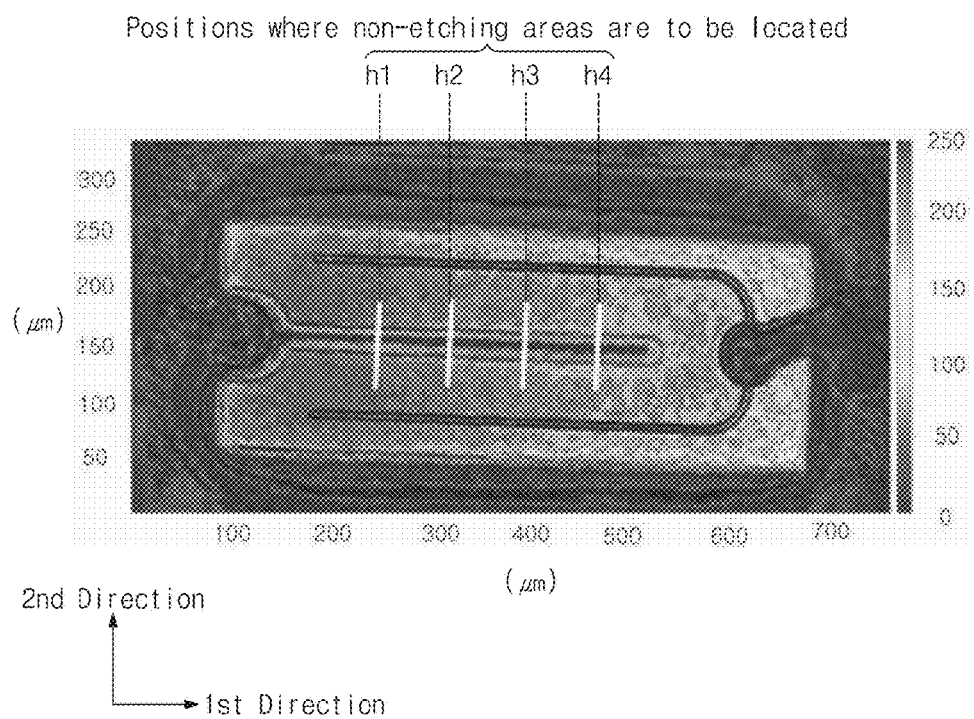
FIGS. 7A and 7B illustrate a light intensity distribution depending on whether multiple n contacts of a horizontal LED according to an example embodiment of the present disclosure are formed.
Figure 7B:
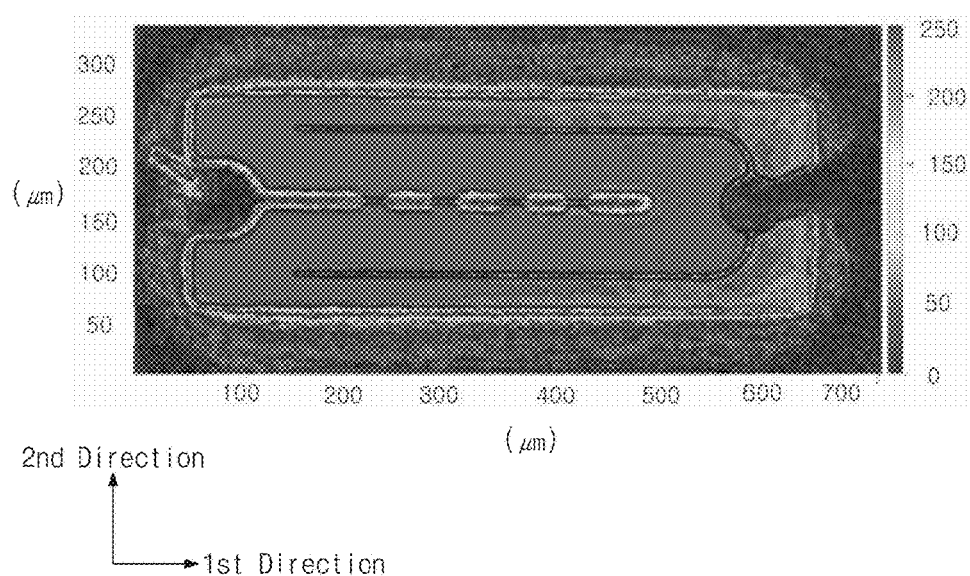

FIGS. 7A and 7B illustrate a light intensity distribution depending on whether multiple n contacts of a horizontal LED according to an example embodiment of the present disclosure are formed.

Referring to FIG. 7A, when multiple n contacts are not formed, a light emitting distribution is concentrated around an n-electrode pad. Positions h1, h2, h3, and h4 of a plurality of non-etching areas are displayed as white lines. Holes may be disposed between the non-etching areas. The holes may be in ohmic contact with an exposed n-type GaN layer.

Referring to FIG. 7B, when multiple n contacts are formed at the positions selected in FIG. 7A, a light emitting distribution is generally uniform and light emitting efficiency increases. A unit of coordinate is micrometer.

Although the present disclosure and its advantages have been described in detail, it should be understood that various changes, substitutions and alterations can be made herein without departing from the spirit and scope of the disclosure as defined by the following claims.

What is claimed is:

1. A horizontal light emitting diode (LED) device comprising:
   a sapphire substrate;
   a n-type GaN layer on the sapphire substrate;
   an activation layer on the n-type GaN layer, the activation layer having a current density space distribution or a light emitting intensity space distribution;
   a p-type GaN layer on the activation layer;
   a current spreading layer on the p-type GaN layer;
   a p-electrode on the current spreading layer;
   a plurality of holes exposing the n-type GaN layer through the current spreading layer, the p-type GaN layer, and the activation layer; and
   an n-electrode on the exposed n-type GaN layer and in ohmic contact with the exposed n-type GaN layer at a bottom surface of each of the plurality of holes,
   wherein a plurality of mesas are formed in respective non-etching areas between adjacent holes of the plurality of holes; and either
   each respective mesa of the plurality of mesas comprises a respective current density space distribution of a current density intensity such that the current density intensity has a constant progression in the first direction from a pad region of the n-electrode to a distal end of the n-electrode; or
   each respective mesa of the plurality of mesas comprises a respective light emitting space distribution of a light emitting intensity such that the light emitting intensity has a constant progression in the first direction from a pad region of the n-electrode to a distal end of the n-electrode.

2. The horizontal LED device as set forth in claim 1, wherein the p-electrode comprises a p-electrode pad and at least two p-electrode fingers branching from the p-electrode pad to extend in the first direction,
   the n-electrode comprises an n-electrode pad and at least one n-electrode finger extending from the n-electrode pad in the first direction,
   the at least one n-electrode finger extends between the at least two p-electrode fingers,
   the plurality of holes are arranged in the first direction, and
   the at least one n-electrode finger is aligned with the plurality of holes.

3. The horizontal LED device as set forth in claim 2, wherein a contact area between the bottom surface of each of the plurality of holes and the n-electrode finger decreases sequentially in a direction toward the p-electrode pad.

4. The horizontal LED device as set forth in claim 2, wherein a width of the activation layer between the adjacent holes of the plurality of holes in the first direction is smaller than a mesa width of each of the plurality of holes and greater than a width of the at least one n-electrode finger in a second direction perpendicular to the first direction.

5. The horizontal LED device as set forth in claim 1, further comprising:
a passivation layer on opposite side surfaces of each of the plurality of holes in the first direction and the current spreading layer between the adjacent holes of the plurality of holes.

6. The horizontal LED device as set forth in claim 5, wherein the passivation layer comprises a distributed Bragg reflector comprising a multilayer structure having different refractive indices.

7. The horizontal LED device as set forth in claim 5, wherein the passivation layer comprises a silicon oxide layer or a magnesium fluoride layer, and
the activation layer, the passivation layer, and the p-electrode are on the n-type GaN layer in sequence to provide an omnidirectional reflector (ODR) structure.

8. The horizontal LED device as set forth in claim 4, wherein the width of the activation layer is constant in the first direction, and
a width of each of each of the plurality of holes along the first direction is different from other ones of the plurality of holes.

9. A method for fabricating a horizontal light emitting diode (LED) device, the method comprising:
forming the horizontal LED device including a mesa structure and an n-electrode finger between p-electrode fingers extending in a first direction to extract a current density space distribution or a light emitting intensity space distribution of the horizontal LED device; and
forming the mesa structure by respectively disposing a plurality of holes between selected positions and aligned in the first direction;
wherein the mesa structure comprises a plurality of mesas formed in respective non-etching areas between adjacent holes of the plurality of holes; and either
each respective mesa of the plurality of mesas comprises a respective current density space distribution of a current density intensity such that the current density intensity has a constant progression in the first direction from a pad region of the n-electrode to a distal end of the n-electrode; or
each respective mesa of the plurality of mesas comprises a respective light emitting space distribution of a light emitting intensity such that the light emitting intensity has a constant progression in the first direction from a pad region of the n-electrode to a distal end of the n-electrode.

10. The method as set forth in claim 9, wherein fabricating the horizontal LED device comprises:
disposing a n-type GaN layer on a sapphire substrate;
disposing an activation layer on the n-type GaN layer, the activation layer having a current density space distribution or a light emitting intensity space distribution;
disposing a p-type GaN layer on the activation layer;
disposing a current spreading layer on the p-type GaN layer;
disposing a p-electrode on the current spreading layer, the p-electrode including a p-electrode pad and the p-electrode fingers branching from the p-electrode pad, and the plurality of holes exposing the n-type GaN layer through the current spreading layer, the p-type GaN layer, and the activation layer; and
disposing an n-electrode on the exposed n-type GaN layer, the n-electrode including an n-electrode pad and the n-electrode finger extending from the n-electrode pad, and n-electrode being in ohmic contact with the exposed n-type GaN layer at a bottom surface of each of the plurality of holes.

11. The method as set forth in claim 10, wherein a contact area between the bottom surface of each of the plurality of holes and the n-electrode finger decreases sequentially in a direction toward the p-electrode pad.

12. The method as set forth in claim 10, wherein a width of the activation layer between the adjacent holes of the plurality of holes in the first direction is smaller than a mesa width of each of the plurality of holes and greater than a width of the n-electrode finger in a second direction perpendicular to the first direction.

13. The method as set forth in claim 9, further comprising:
disposing a passivation layer on opposite side surfaces of each of the plurality of holes in the first direction.

14. The method as set forth in claim 13, wherein the passivation layer comprises a distributed Bragg reflector comprising a multilayer structure having different refractive indices.

15. The method as set forth in claim 13, wherein the passivation layer comprises a silicon oxide layer or a magnesium fluoride layer, and
the activation layer, the passivation layer, and the p-electrode are on the n-type GaN layer in sequence to provide an omnidirectional reflector (ODR) structure.

16. The method as set forth in claim 12, wherein the width of the activation layer is constant in the first direction, and
a width of each of the plurality of holes along the first direction is different from other ones of the plurality of holes.

17. The method as set forth in claim 9, wherein the n-electrode finger is aligned with e plurality of holes.

18. The horizontal LED device as set forth in claim 5, wherein the passivation layer comprises alternating silicon oxide and titanium oxide layers.

* * * * *